United States Patent [19]
Krusel et al.

[11] Patent Number: 5,838,535
[45] Date of Patent: Nov. 17, 1998

[54] HOUSING FOR ELECTRIC COMPONENTRY

[75] Inventors: William Krusel, Brighton, Mich.; Jens Gröger, Hanover; Rainer Risse, Pattensen, both of Germany; Richard A. Romer, Grosse Pointe; Thomas Corcoran, Troy, both of Mich.; Harald Kaess, Isernhagen, Germany

[73] Assignee: WABCO GmbH, Hanover, Germany

[21] Appl. No.: 780,927

[22] Filed: Jan. 9, 1997

[30] Foreign Application Priority Data

Jan. 17, 1996 [DE] Germany .................. 196 01 518.9

[51] Int. Cl.⁶ .................................................. H02B 1/00
[52] U.S. Cl. ............................................. 361/679; 361/827
[58] Field of Search ................... 174/50, 52, 50.53; 361/600, 679, 608, 728, 730, 736, 752, 826, 827

[56] References Cited

U.S. PATENT DOCUMENTS

| | | |
|---|---|---|
| 3,900,769 | 8/1975 | Russo, Jr. . |
| 5,253,143 | 10/1993 | Klinger et al. ............... 361/679 |
| 5,311,398 | 5/1994 | Schirmer et al. . |

FOREIGN PATENT DOCUMENTS

| | | |
|---|---|---|
| 0 353 443 A2 | 2/1990 | European Pat. Off. . |
| 33 478 | 11/1964 | Germany . |
| 21 41 064 C3 | 3/1973 | Germany . |
| 77 08 289 | 9/1977 | Germany . |
| 29 16 448 C2 | 11/1980 | Germany . |
| 34 15 734 A1 | 11/1984 | Germany . |
| 86 02 543 U1 | 6/1986 | Germany . |
| 86 28 993 U1 | 2/1987 | Germany . |
| 87 01 696 U1 | 5/1987 | Germany . |
| 41 02 265 A1 | 7/1992 | Germany . |
| 41 05 265 A1 | 7/1992 | Germany . |
| 90 03 917 U1 | 7/1993 | Germany . |
| 42 07 850 A1 | 9/1993 | Germany . |
| 93 15 970 U1 | 1/1994 | Germany . |
| 94 05 476 U1 | 9/1995 | Germany . |
| 654 958 A5 | 3/1986 | Switzerland . |
| 681 837 A5 | 5/1993 | Switzerland . |
| WO 91 07865A | 5/1991 | WIPO . |

*Primary Examiner*—Gregory D. Thompson
*Attorney, Agent, or Firm*—Proskauer Rose LLP

[57] ABSTRACT

A housing for electric componentry comprises a closed frame in which the electric componentry is received, a first electric connection element which is connected to the electric componentry and passes through a wall of the frame, a second electric connection element which is connected to the first electric connection element, and an electric connection cable which is connected to the second electric connection element. A fastening element fastens the electric connection cable to the frame of the housing in such manner that the cable lies parallel to a flat outer surface of the frame. At least a part of the fastening element is constructed integrally with the housing. In a preferred embodiment, the housing further comprises a cover attached by a hinge to the frame. Further, the fastening element comprises first and second parts which bear upon each other with the electric connection cable therebetween. One of the parts of the fastening element is integral with the cover, so that the electric connection cable is fastened to the housing in proper fashion merely by closing the cover of the housing.

9 Claims, 1 Drawing Sheet

HOUSING FOR ELECTRIC COMPONENTRY

BACKGROUND OF THE INVENTION

The present invention relates to a housing for electric componentry comprising the housing itself, at least one electric connection element passing through a wall of the housing and connected to the electric componentry inside the housing, a second electric connection element which is connected to the first electric connection element, and electric connection cables connected to the second electric connection element, the electric connection cables being arranged on an outer surface of the housing.

A housing of this type is known from DE 41 02 265 A1 (U.S. Pat. No. 5,311,398).

Housings of this type are used on installation sites where they are subjected to external electromagnetic and environmental influences. It is expected of such a housing that the electric componentry contained within be securely protected from such interfering influences. When such a housing is installed on a motor vehicle body or in the engine space of a motor vehicle, for example, it is particularly important that the housing and the parts connected to it, such as, the plug-in electric connectors, be leakproof and that they maintain this characteristic over time. In practical use of such housings and plug-in connectors under the conditions described above, it often happens, however, that leakage occurs due to the unplugging and the plugging back in of the plug-in connectors, or due to the tensile load on the connectors, or due to nicks in the insulation on the cables connected to the plug-in connectors.

The known housing mentioned above meets some of these requirements and furthermore offers the possibility of achieving particularly compact construction when a plug-in connector with a coupling direction parallel to the plane of the housing surface is used.

In the known housing, however, it is a disadvantage that the electric connection cables emerging from the coupling part of the plug-in connectors are either not fastened at all, or that their fastening is effected at a distance from the plug-in connector. The responsibility of selecting an appropriate fastening point for the connection cables is therefore left to the user or to the installer of the electronic apparatus. If the selection of this fastening point is poorly made, it is possible that mechanical loads on the electric connection cables transmitted to the coupling portion of the plug-in connection, such as tensile loads or vibrations, may affect the leakproof character of the plug-in connection. It is a further disadvantage that with this type of fastening of the electric cables additional auxiliary means, such as separate fastening elements or mounting tools, are needed to effect the fastening. Furthermore, assembly of the fastening elements is a separate and additional step apart from the assembly of the housing itself.

It is therefore the object of the present invention to provide a housing for electric componentry in a space-saving embodiment with simplified and less expensive assembly, and which provides for the fastening of the electric connection cables in such manner that the leakproof character of the plug-in connection is ensured over time.

SUMMARY OF THE INVENTION

A housing for electric componentry comprises a closed frame in which said electric componentry is received, a first electric connection element which is connected to the electric componentry and passes through a wall of the frame, a second electric connection element which is connected to the first electric connection element, and an electric connection cable which is connected to the second electric connection element. A fastening element fastens the electric connection cable to the frame of the housing in such manner that the cable lies substantially parallel to a flat outer surface of the frame. At least a part of the fastening element for the cables is integral with the housing. Preferably, the housing includes a cover which is attached by a hinge to the frame. Further, the fastening element comprises first and second parts which bear upon each other with the electric connection cable therebetween. One of these parts of the fastening element is integral with the cover of the housing, so that the electric connection cable is fastened to the housing in proper fashion merely by closing the cover of the housing.

One advantage of the housing of the present invention consists in the fact that the electric connection cable is fastened by a fastening element which is at least partially integral with the housing, so that on the one hand, the design of the housing already provides for a particularly well-suited fastening point, and on the other hand, the expenditure in work and money for the fastening device which is absolutely necessary for purposes of strain relief of the connection cable, is minimized. In addition, the user/installer of the housing is relieved of the chore of selection of a suitable fastening point for the connection cable.

Due to the fact that the housing is designed so as to have a zone in which the electric connection cables are placed parallel to the plane extension of the housing surface and are also fastened thereon, the mechanical load on the electric connection cables is reduced to a minimum. This type of fastening makes it possible to avoid tensile forces as well as bending forces which could occur as a result of a lateral movement of the electric connection cables if the fastening point is poorly selected. After assembly, the frame, the first and the second electric connection elements, the first part of the fastening element and part of the electric connection cable constitute a compact unit, the elements of which can no longer alter their positions relative to each other. As a result, the housing is especially suitable at sites of installation where a good leakproof character is required, such as in the engine space or on the body of a motor vehicle.

Furthermore, since a part of the fastening element is integral with the housing, it is possible to combine the manufacturing process of these two elements into one common production step.

In an advantageous further development of the invention, the housing is designed with a cover for the first and the second electric connection elements. Such a cover has the advantage that the first and second electric connection elements as well as a segment of the electric connection cables are protected from environmental influences, such as water spray or falling rocks. This cover can be made integrally with a second portion of the fastening means in a particularly advantageous manner, whereby the two portions of the fastening means are designed so that they bear upon each other. In addition to the advantage of further simplification of the manufacturing process in a one-piece design of the second portion of the fastening means and the cover, this embodiment also offers the advantage that the second portion of the fastening means enhances the first portion of the fastening means and its advantageous effects.

A simplification in fastening the electric connection cables by the fastening means as well as in the assembly of the cover is achieved through an advantageous further development of the invention whereby the fastening of the electric connection cables is effected solely by the closing of the cover. This simplified fastening of the electric connection cables enables the omission of certain assembly steps insofar as such steps are required with conventional fastening means, such as screw connections. Furthermore, accidental wrong installation of parts of the fastening means is avoided, as is failure to install them at all.

In an especially advantageous embodiment of the invention, the first and the second parts of the fastening means are made so as to receive a sleeve surrounding the electric cables in a positive manner, e.g., by means of grooves in the first and second parts of the fastening means adapted to grip the corrugated outer surface of the sleeve. Thus, any force acting on the connection cables as might occur with non-positive locking fastening means, e.g., in the form of pinching, is avoided.

In another embodiment, the housing is provided with attachment elements by means of which the cover is attached to the housing. Preferably, hinges are used as the attachment elements, these having the advantage that the cover does not get lost in its open state and closing of the cover is simplified because the exact position on the housing is already established by the manufacturer.

In another further development, the housing is made of metal, so that on the one hand, it is mechanically very stable, and on the other hand, the electric componentry inside is protected from electromagnetic interference. This further development renders the housing especially suitable for use in a motor vehicle, e.g., in conjunction with an electronic control unit. The cover may, however, also be made of plastic if desired in order to minimize manufacturing costs, because the requirements for mechanical strength are lower for the cover than for the housing. Selecting plastic for the cover also provides better recycling possibilities than a compound material, such as plastic coated with a metal coating as may be used for the housing material.

In another further development of the invention, the first electric connection element which is connected to the electric componentry is made in the form of an angled plug. This has the advantage that the plugging forces are not transmitted directly to the electric componentry. Further improvement can be obtained if the first electric connection element is provided with long connection legs, since this best compensates for the remaining bending forces and also thermal distortion, in operation, between the electric componentry and the first electric connection element. By placing the electric connection cables parallel with the housing surface, a straight-line laying of the connection cables up to and into the second electric connection element is made possible. This simplifies installation of the connection cables in the second electric connection element and furthermore results in a better seal at the transition point between connection cable and connection element because cables laid down in a straight line do not transmit any lateral forces to a seal that may be installed within the second electric connection element, for example.

In an advantageous further development of the invention, the housing consists of at least two housing parts joined along a plane of separation, whereby the separation plane extends perpendicular to the electric componentry, so that in order to install the electric componentry in the housing, the housing parts can be opened laterally over the printed circuit board. By comparison with the separation plane of the known housing, which extends parallel to the electric componentry, the housing according to the invention offers the advantage, because of a small separation plane, of ensuring good leakproof characteristics even with lower expenditures for sealing and assembly means, and thereby also ensuring a shorter assembly time.

In a further development, the first electric connection element connected to the electric componentry is fastened to the wall of the housing merely by exerting pressure as the housing parts are fitted together, and in this case a seal between housing and plug-in connection is provided at the same time.

BRIEF DESCRIPTION OF THE DRAWINGS

The invention is explained in further detail through an embodiment illustrated in the drawings, wherein.

DETAILED DESCRIPTION OF THE PREFERRED EMBODIMENT

Figure 1:
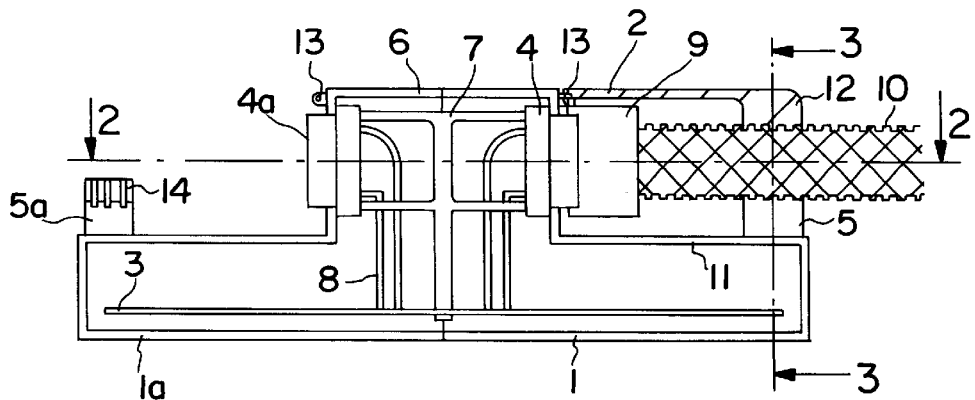
FIG. 1 shows a side view of the housing in section.
Figure 2:
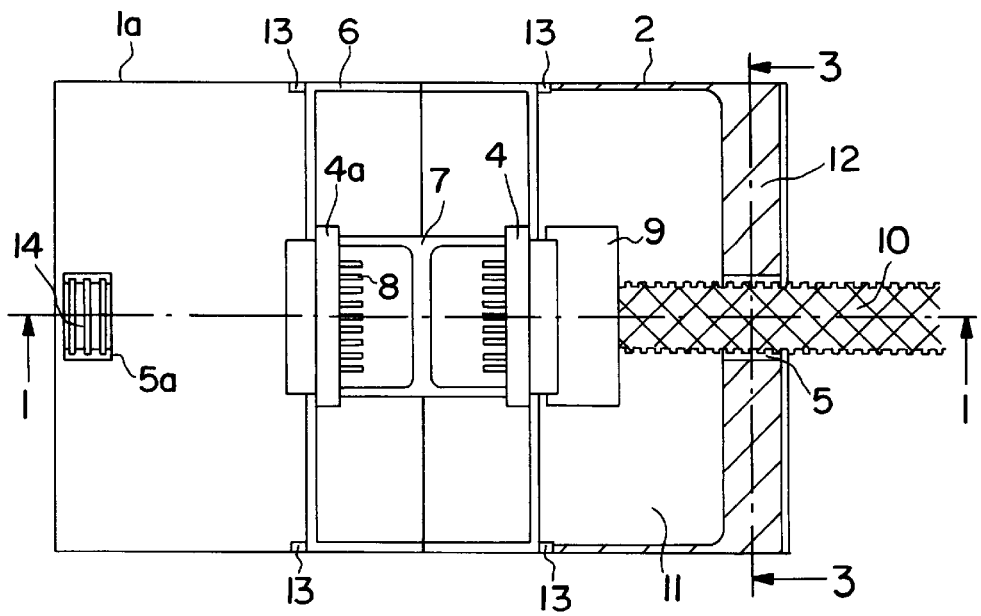
FIG. 2 shows a top view of the housing taken along sectional lines 2—2 of FIG. 1.
Figure 3:
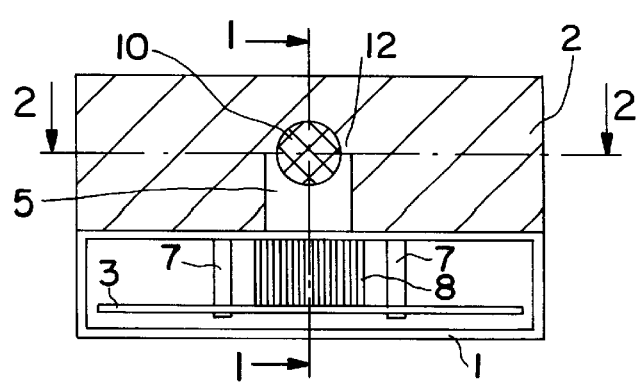
FIG. 3 shows a front view of the housing taken along sectional lines 3—3 of FIGS. 1 and 2.

The same reference numbers are used in FIGS. 1, 2 and 3 for the same parts. The view shown in FIG. 1 taken along sectional lines 1—1 of FIGS. 2 and 3 shows a housing consisting of two housing parts (1, 1a) which are connected to each other and form a closed box-like frame. Screws can be used to connect the two housing parts together but these are not shown here. Although both housing parts (1, 1a) are equally suitable to receive all elements, for purposes of clarity, not all of the elements associated with housing part (1a) are shown. Inside the housing, electric componentry (3) is installed, e.g., in the form of a printed circuit board. In a raised, pedestal-shaped part (6) of the housing, first electric connection elements (4, 4a) are installed in the two housing parts (1, 1a) and are pressed from the inside through the walls of the housing.

The first electric connection element (4) is shown connected to a second electric connection element (9) as its counterpart which is in turn provided with electric connection cables (10). In one embodiment of the invention, the two parts of the fastening means (5, 5a and 12) are provided with grooves (14), shown most clearly on the fastening means (5a), which are designed to interlock with the outer surface of the electric connection cables (10), for example, when the electric connection cables (10) are held in a sleeve in the form of a corrugated pipe (see FIGS. 1 and 2)

However, the utilization of a cover (2) to fasten the electric connection cable to the fastening means (5, 5a) is more advantageous. This cover (2), which is attached to the housing part (1) by means of hinges (13), covers the electric connection elements (4, 9) as well as part of the electric connection cables (10). The cover (2) is furthermore provided with a portion which comprises the second part (12) of the fastening means for the electric connection cables (10) and can be brought into contact with the first part of the fastening means (5, 5a) (see especially FIG. 3). As a result, the elements located inside the cover (2) are protected on the one hand from environmental influences, and on the other hand the second part (12) of the fastening means (5, 5a), which is integral with the cover (2), replaces the above-mentioned additional auxiliary item (clip) used to fasten the electric connection cables (10). Thus, in the present invention, fastening takes place solely through the closing of the cover (2). In closed condition, the cover (2) can be immobilized, e.g., by screws or by a catch (not shown).

In one embodiment of the invention in which the electric connection cables (10) are held in a sleeve which surrounds them, whereby this sleeve is in the form of a corrugated pipe, the two parts of the fastening means (5, 5a and 12) are provided with grooves (14), shown with the fastening means (5a), which are designed to receive the corrugated pipe in an interlocking manner.

A plug can be used as the first electric connection element (4, 4a), for example, and a coupling element as the second electric connection element (9). The plugs (4, 4a) are also held by additional fastening means (7) against the walls of the housing. The additional fastening means (7), which may be made in one piece with the plugs (4, 4a) or as separate parts, help relieve the load on the electric connection legs (8) of the plugs (4, 4a) when plugging in or pulling out the coupling element (9). The electric connection legs (8) as well as the additional fastening means (7) are connected to the electric printed circuit board (3), e.g., by soldering, clamping or screwing.

The above-described design of the housing results in advantages for the manufacture and installation of the electric printed circuit board as well as for the entire electric apparatus, for the manufacturer as well as for the user/installer.

The manufacture of the electric apparatus can be effected as follows, for example:

The printed circuit board (3) is first provided with the additional fastening means (7) as well as with the plugs (4, 4a) and possibly other components to be attached by soldering. This is followed by soldering, e.g., in a solder bath or by means of a soldering rod. This is followed by a test of the functioning of the electric apparatus which is very much simplified due to the fact that on the one hand the contacting of testing points directly on the printed circuit board (3) is not hindered by housing parts, and on the other hand the plugs (4, 4a) which are now already connected to the printed circuit board (3) can also be used for contacting peripheral components or testing devices. In addition, the plugs (4, 4a) can be checked for faultless soldering. Thus, the entire testing of the electric functioning of the apparatus can be carried out already at this point, whereupon only the mechanical assembly in the housing needs to be completed.

This assembly is effected by laterally sliding the two housing parts (1, 1a) over the previously described electric componentry and by screwing the housing parts (1, 1a) together. Thereby, the plugs (4, 4a) are pressed against the respective housing parts (1 or 1a). Additional attachment of the plugs (4, 4a) to the housing parts (1, 1a), e.g., by screwing, is not necessary. The forces to which the plugs (4, 4a) are subjected due to pressing against the housing parts (1, 1a) or caused by plugging in or pulling out the coupling element (9) are absorbed by the additional fastening means (7).

In a final manufacturing step, the cover (2) is attached to the housing by means of the hinges (13).

The installation of the electric apparatus can be effected, e.g., as follows:

The housing is installed by means of screws, for example, at the installation site, e.g. in the engine space or on the frame of a vehicle. The coupling element (9) provided with the electric connection cables (10) is then slid into the plug (4). Finally, the cover (2) is closed and stopped by means of a catch or screws. Thereby, the two parts (5 and 12) of the fastening means positively surround the connection cables which are surrounded by a corrugated pipe.

While the invention has been described by reference to a specific embodiment, this was for purposes of illustration only. Numerous alternative embodiments will be apparent to those skilled in the art and are considered to be within the scope of the invention.

We claim:

1. A housing for electric componentry, comprising a closed frame in which said electric componentry is received, a first electric connection element which is connected to said electric componentry and which passes through a wall of said frame, a second electric connection element which is connected to said first connection element, an electric connection cable connected to said second electric connection element, a cover attached to said frame, said first and second electric connection elements being received within said cover, and a fastening element which fastens said electric connection cable to said housing such that said electric connection cable is arranged parallel to a flat outer surface of said frame, said fastening element comprising first and second parts which bear against each other with said electric connection cable therebetween, said first part of said fastening element being integral with said frame, and said second part of said fastening element being integral with said cover, said housing being configured so that said first and second parts of said fastening element are caused to bear against each other with said electric connection cable therebetween by closing of said cover.

2. The housing of claim 1 wherein said first and second parts of said fastening element include elements for receiving said electric connection cable in an interlocking manner when said first and second parts bear against each other.

3. The housing of claim 2 wherein said elements for receiving said electric connection cable in an interlocking manner comprise grooves on said first and second parts of said fastening element.

4. The housing of claim 1 wherein said frame is made from a metallic material and said cover is made from a plastic material.

5. The housing of claim 1 wherein said first electric connection element comprises an angled plug.

6. The housing of claim 1 further comprising an additional fastening element for securing the connection of said first electric connection element to said electric componentry.

7. The housing of claim 1 wherein said frame comprises first and second frame parts joined along a plane of separation, said separation plane being substantially perpendicular to said electric componentry.

8. The housing of claim 7 which is configured so that said first electric connection element becomes attached to said wall of said frame upon assembly of said first and second frame parts to each other.

9. The housing of claim 1 wherein said wall of said frame through which said first connection element passes comprises a part of a raised, pedestal-shaped part attached to said frame.

* * * * *